United States Patent [19]
Walker

[11] Patent Number: 5,081,411
[45] Date of Patent: Jan. 14, 1992

[54] AC/DC TWO-WIRE CONTROL TECHNIQUES

[75] Inventor: James M. Walker, Fond du Lac, Wis.

[73] Assignee: Honeywell Inc., Minneapolis, Minn.

[21] Appl. No.: 630,829

[22] Filed: Dec. 20, 1990

[51] Int. Cl.$^5$ .................. H02J 3/12; H02M 5/44
[52] U.S. Cl. ................... 323/326; 323/324; 323/285; 363/89
[58] Field of Search .............. 363/89, 53, ; 323/285, 323/286, 287, 324, 319; 361/100, 101

[56] References Cited

U.S. PATENT DOCUMENTS

| | | | |
|---|---|---|---|
| 3,781,653 | 12/1973 | Marini | 323/284 |
| 4,415,945 | 11/1983 | Periot | 361/100 |
| 4,504,778 | 3/1985 | Evans | 323/323 |
| 4,745,300 | 5/1988 | Kammerer et al. | 307/112 |
| 4,806,843 | 2/1989 | Mertens et al. | 323/271 |
| 4,843,300 | 6/1989 | Alderman | 323/224 |
| 4,878,010 | 10/1989 | Weber | 323/300 |
| 4,942,510 | 7/1990 | Edwards | 363/127 |
| 5,025,134 | 6/1991 | Bensoussan et al. | 219/494 |

Primary Examiner—Steven L. Stephan
Assistant Examiner—Ben Davidson
Attorney, Agent, or Firm—William D. Lanyi

[57] ABSTRACT

An apparatus and method is disclosed for controlling a load capable of functioning for a predetermined purpose in response to a predetermined amount of electrical power. The load can be operated from either an AC or DC source using a two-wire connection. The predetermined amount of electrical power is applied to the load if a sensor senses a triggering event. During the time period when a triggering event is sensed, power is cycled on and off to the load in order to enable continuous monitoring of the trigger event. During most of the time period, the sensor receives power to maintain its operations from a storage circuit. If the charge in a capacitor decreases to a predetermined value, the predetermined amount of electrical power is removed from the load momentarily to allow replenishment of the capacitor charge.

2 Claims, 6 Drawing Sheets

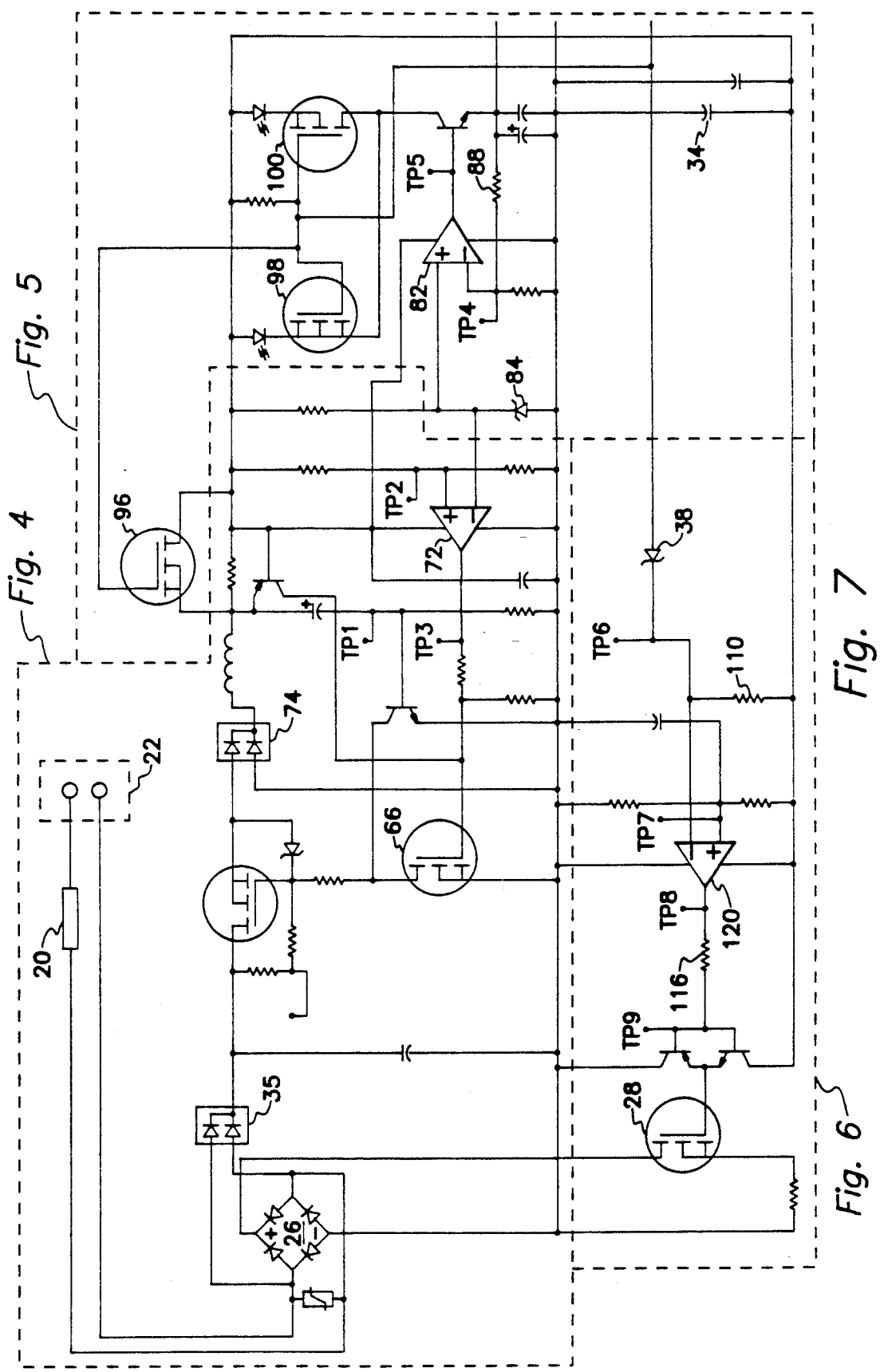

AC/DC TWO-WIRE CONTROL TECHNIQUES

FIELD OF THE INVENTION

This invention relates to the field of AC/DC two-wire power control and sensing circuits and is more particularly related to a device and method for allowing sensors and transducers to operate a load by means of a two-wire connection to an AC or DC power source.

BACKGROUND OF THE INVENTION

The electrical system known as a two-wire sensor is a device which has a high impedance when a triggering event (e.g., the presence of an object) is sensed and a low impedance when a triggering event is not sensed. In order to control the operation of an electrical load (e.g., a relay or an input to a programmable controller), the two-wire sensor is connected to an electrical power source in series with the load. Depending upon the presence or absence of a triggering event, the two-wire sensor turns the load "off" or "on." When the load is off (i.e., the two-wire sensor is in the high impedance mode), enough current must pass through the load to operate the sensor. If the current is insufficient, the sensor cannot sense a triggering event and cannot turn on the load in response to the triggering event. However, the current must be sufficiently low to prevent operation of the load. If the load is on (i.e., the two-wire sensor is in the low impedance mode), there must be sufficient power to operate the sensor. If the power is insufficient, the sensor cannot continue to sense the presence or absence of a triggering event. Previous known two-wire sensors fall into one of two broad categories: delayed turn-on circuits and continuous mode circuits.

A typical delayed turn-on circuit is shown in FIG. 1. The delayed turn-on circuit comprises: (1) a voltage supply 200; (2) a load 202; (3) a full wave bridge rectifier 204 (rectifier circuit, which is comprised of diodes 206, 208, 210 and 212); (4) an SCR 214; (5) resistors 216, 222 and 230; (6) a zener diode 218; (7) a capacitor 220; (8) voltage regulators #1 and #2, which are 224 and 228, respectively; (9) transistors 226 and 232; and (10) a sensor 234, all interconnected as shown in FIG. 1.

In the delayed turn-on circuits, an SCR 214 is used as a solid state switch to cause a high and low impedance path for the load current. Just prior to the turn-on or firing of the SCR 214, a transistor 226 (or sometimes a second SCR) is momentarily turned on to charge a capacitor 220. When the voltage across the capacitor 220 attains the breakdown voltage of a zener diode 218 connected in series with the gate of the SCR 214, the SCR 214 is gated into its low impedance mode, and the charge stored on capacitor 220 acts as a storage device for the balance of the AC current cycle in order to power the sensor 234 via voltage regulator #2 228. Each time the AC cycle crosses zero volts, the SCR 214 turns off and does not turn on until the capacitor's charge is replenished. Since the capacitor 220 must be recharged every half cycle, delayed turn-on circuits can only be used with AC voltage inputs.

A typical continuous mode circuit is shown in FIG. 2. The continuous mode circuit comprises: (1) a voltage supply 300; (2) a load 302; (3) a full wave bridge rectifier 304 (which is comprised of diodes 306, 308, 310 and 312); (4) an SCR 314; (5) resistors 316, 318 and 320; (6) diodes 322 and 324; (7) zener diode 326; (8) capacitor 328; (9) transistor 330; and (10) sensor 332, all interconnected as shown in FIG. 2.

The continuous mode circuits use a zener diode 326 and an SCR 314 in series, so that current is supplied from the SCR 314 and zener diode 326 via diode 322 to power the sensor 332 when the SCR 314 is in its low impedance mode. Further, in this state, resistor 320 provides a path for current to charge capacitor 328 and for current to the sensor 332. Diode 324 and zener diode 326 provide adequate voltage regulation.

Continuous mode circuits have at least two disadvantages. First, there must be approximately 6 to 8 volts across the zener diode 326 in order to produce a high enough voltage to operate the sensor's electronics. Second, due to the power dissipated in the zener diode 326 (4 watts at 500 milliamps for 8 volts and 3 watts at 500 milliamps at 6 volts), package size increases, reliability decreases, and load current switching capability is limited.

Accordingly, it is a primary object of the present invention to provide a two-wire power control and sensing circuit which can switch AC or DC power, operate over wide supply voltage ranges (20 to 260 volts AC or DC) and switch 500 milliamps or more.

Another object of the present invention is to provide a two-wire sensor having a small package size and minimal power dissipation.

Yet another object of the present invention is to provide a two-wire sensor that can replenish a voltage supply for a sensing function whenever required.

SUMMARY OF THE INVENTION

Many electrical loads can be turned "off" by passing a low quantity of electrical power through them, and can be turned "on" by passing a higher predetermined quantity of electrical power through them that enables the loads to perform their predetermined purpose. The applicant has discovered that such loads can be accurately controlled from either an AC or DC source in response to a sensed predetermined condition (e.g., the presence of an object) with minimum power dissipation by new techniques that differ in kind from known prior approaches.

According to a preferred form of the invention, a switch is used to conduct the predetermined quantity of AC or DC power through the load during a first operating state (the first state) in response to a first gating signal and is used to prevent conduction of the predetermined quantity of electrical power through the load during a second operating state (the second state) in response to a second gating signal. Electrical energy is stored (e.g., by a capacitor) in response to the AC or DC source in order to enable the monitoring of the predetermined condition. The monitoring can be performed by known sensors that detect a variety of conditions.

When the predetermined condition is detected by the sensor, a cyclical form of operation is initiated in order to continue monitoring by the sensor while the load is performing its intended function. Initially, the load is switched to its first operating state in which the intended function begins to be performed. During the first operating state, monitoring continues by using the stored electrical energy to operate the sensor. When the stored electrical energy decreases below a predetermined value, the load briefly is switched to its second operating state in order to allow the replenishing of the stored electrical energy. Replenishing is needed in order to continue monitoring by the sensor. When the stored electrical energy is increased, the load is switched back to the first operating state, and the functioning of the load for its intended purpose continues. The cyclical operation occurs during the period of time in which the predetermined condition is detected by the sensor.

The foregoing techniques offer a number of advantages. By switching the load in response to the value of the stored electrical energy, low impedance devices, such as field effect transistors, can be used as the switch, and the switch can be gated irrespective of whether an AC or DC source is connected to the load. Such low impedance switches minimize power dissipation and reduce the size and expense of a resulting product. According to another feature of the invention, different levels of regulation can be used to store the electrical energy and operate the sensor. For example, a pre-regulated voltage can be used to store the electrical energy and a regulated voltage responsive to the electrical energy can be used to operate the sensor. Such a feature facilitates the use of either an AC or DC source and optimizes energy storage. Another feature of the invention facilitates the switching of the load during the cyclical operation. For example, a reference voltage can be generated from the output of the sensor, and a comparator can be used to compare the reference voltage with a voltage proportional to the value of the stored electrical energy. By using the foregoing techniques, a load can be controlled from an AC or DC source by a two-wire connection while a sensor simultaneously monitors a predetermined condition with a degree of efficiency and convenience unattainable by the prior art.

BRIEF DESCRIPTION OF THE DRAWINGS

These and other objects, advantages and features of the invention will hereafter appear for purposes of illustration, but not of limitation, in connection with the accompanying drawings in which like numbers refer to like parts throughout and in which:

FIG. 7 shows the manner in which FIG. 4 through FIG. 6 are connected.

DETAILED DESCRIPTION OF THE PREFERRED EMBODIMENT

Figure 1:
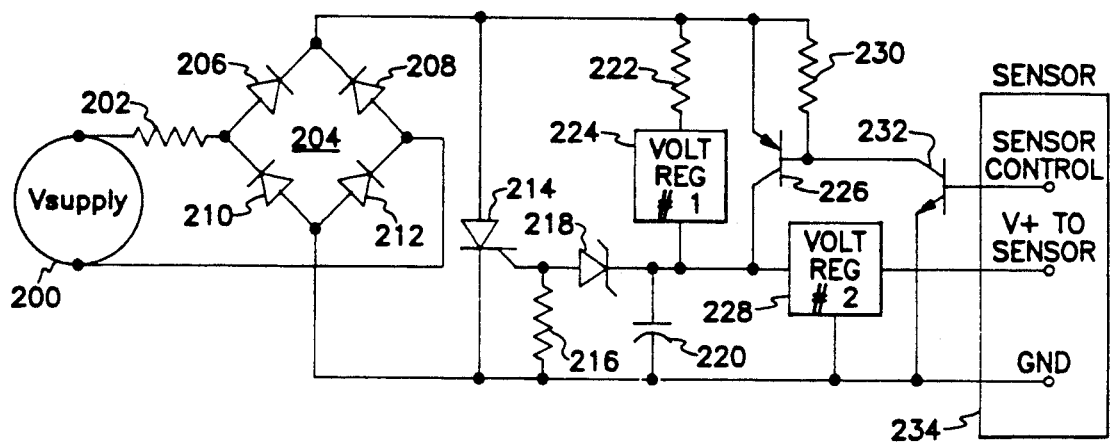
FIG. 1 is a schematic diagram of a typical prior art delayed turn-on circuit.
Figure 2:
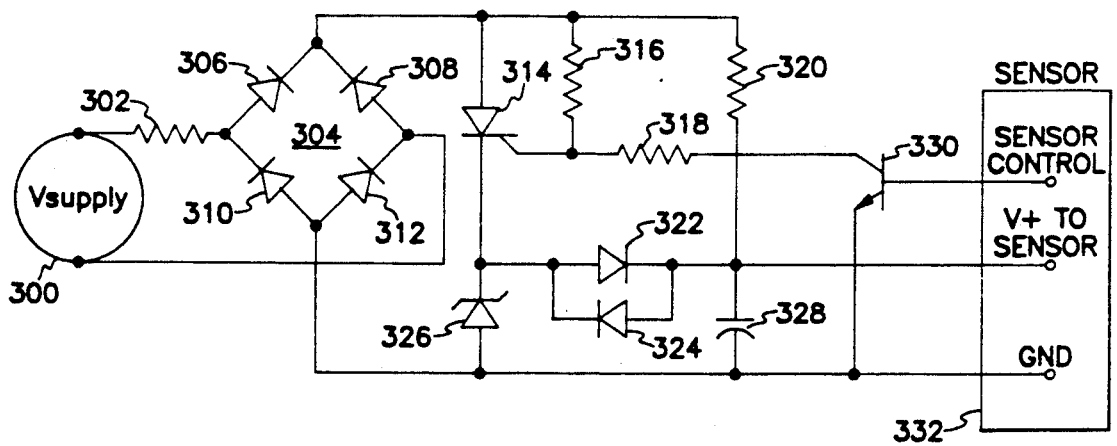
FIG. 2 is a schematic diagram of a typical prior art continuous mode circuit.
Figure 3:
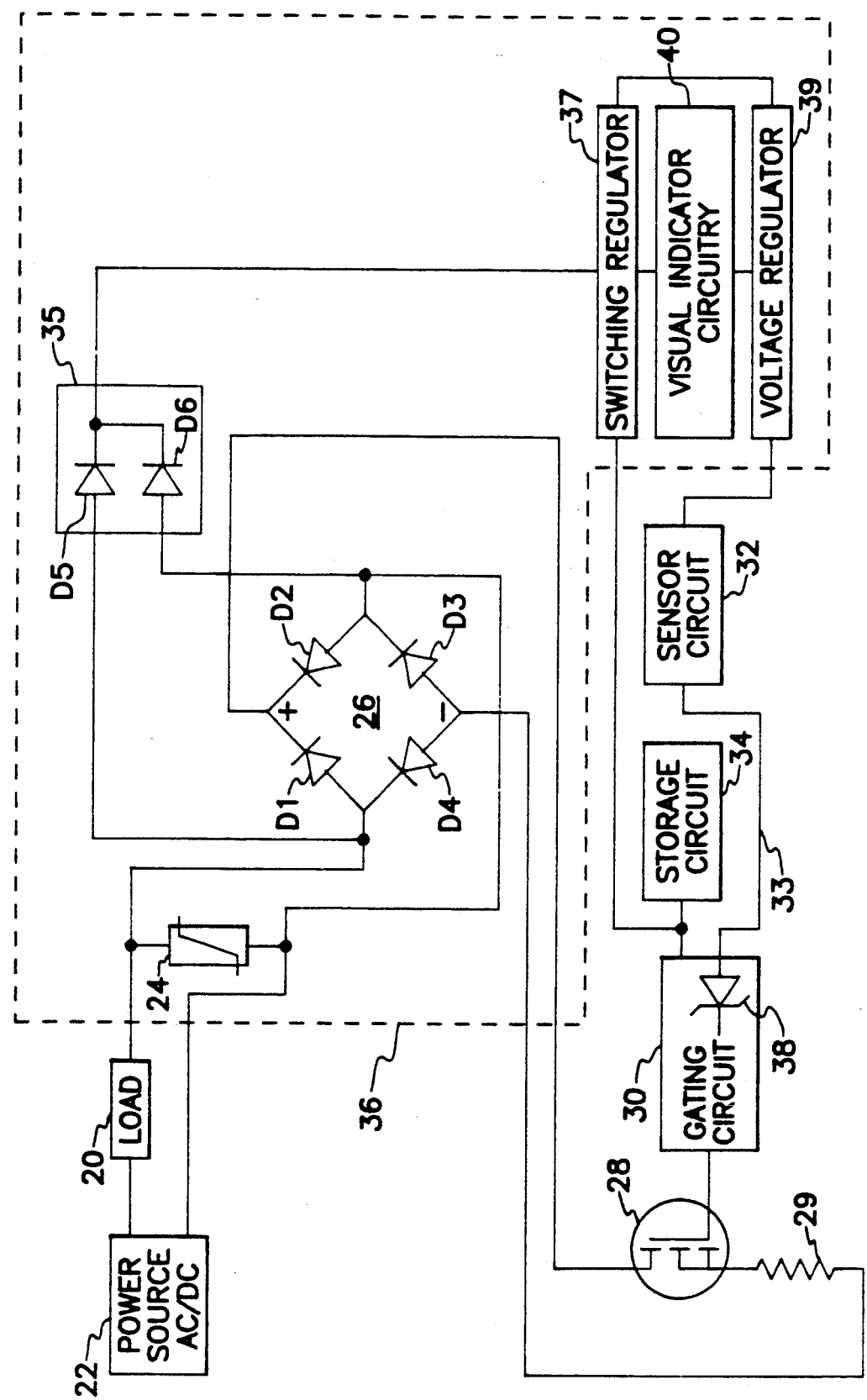
FIG. 3 is a schematic block diagram of a preferred form of an AC/DC two-wire power and sensor circuit made in accordance with a preferred form of the present invention.

Referring to FIG. 3, a preferred form of the present invention can be used to control a load 20 powered by an electrical power source 22 capable of supplying voltage in the range of 20-260 volts AC or 20-260 volts DC. In such a system, the preferred form of the invention basically comprises an electronic switch 28 (preferably a field effect transistor), a resistor 29, a gating circuit 30, an example of a gating means, a sensor circuit 32, an example of a sensing means, a storage circuit 34, an example of a storage means, and a regulator circuit 36, all connected as shown. The regulator circuit 36 (preferably a "Buck regulator"), the means used to regulate voltage, is further comprised of a metal oxide varistor 24, a full wave bridge rectifier 26, including diodes D1-D4, a dual diode rectifier 35, a switching regulator 37, a voltage regulator 39, and visual indicator circuitry 40. The dual diode rectifier is further comprised of diodes D5 and D6.

Still referring to FIG. 3, load 20 only has a minimal amount of current flowing through it if switch 28 is in its high impedance state. With switch 28 in its high impedance state, regulator circuit 36 (FIG. 4) provides sufficient power to operate sensor circuit 32, and regulator circuit 36 charges storage circuit 34 to approximately 8.5 volts. Once sensor 32 detects the presence of a condition for which the load 20 should be turned on (i.e., at least a predetermined quantity of current sufficient to operate the load should flow through the load), sensor 32 outputs a signal to gating circuit 30 over a conductor 33. Next, gating circuit 30 switches switch 28 into a low impedance mode that permits current to flow through load 20. In the low impedance mode, storage circuit 34 discharges, supplying the necessary power to sensor circuit 32 to keep it operating. Eventually, the storage circuit will have discharged to a point where it cannot continue to supply enough power to sensor circuit 32 to keep it operative. When this happens, gating circuit 30 temporarily switches switch 28 to its high impedance state, and load 20 only has minimal current flowing through it. At this point, regulator circuit 36: (1) provides power to sensor circuit 32; and (2) provides sufficient power to recharge storage circuit 34. Once storage circuit 34 is sufficiently recharged, gating circuit 30 switches switch 28 back into its low impedance mode. At this point: (1) current sufficient to operate load 20 flows through load 20 again; (2) storage circuit 34 begins to discharge again; and (3) sensor circuit 32 receives power necessary to operate it from storage circuit 34 again. The time necessary to recharge storage circuit 34 is about one-tenth the time storage circuit 34 (starting from a fully charged state) can keep sensor circuit 32 operational.

Figure 4:
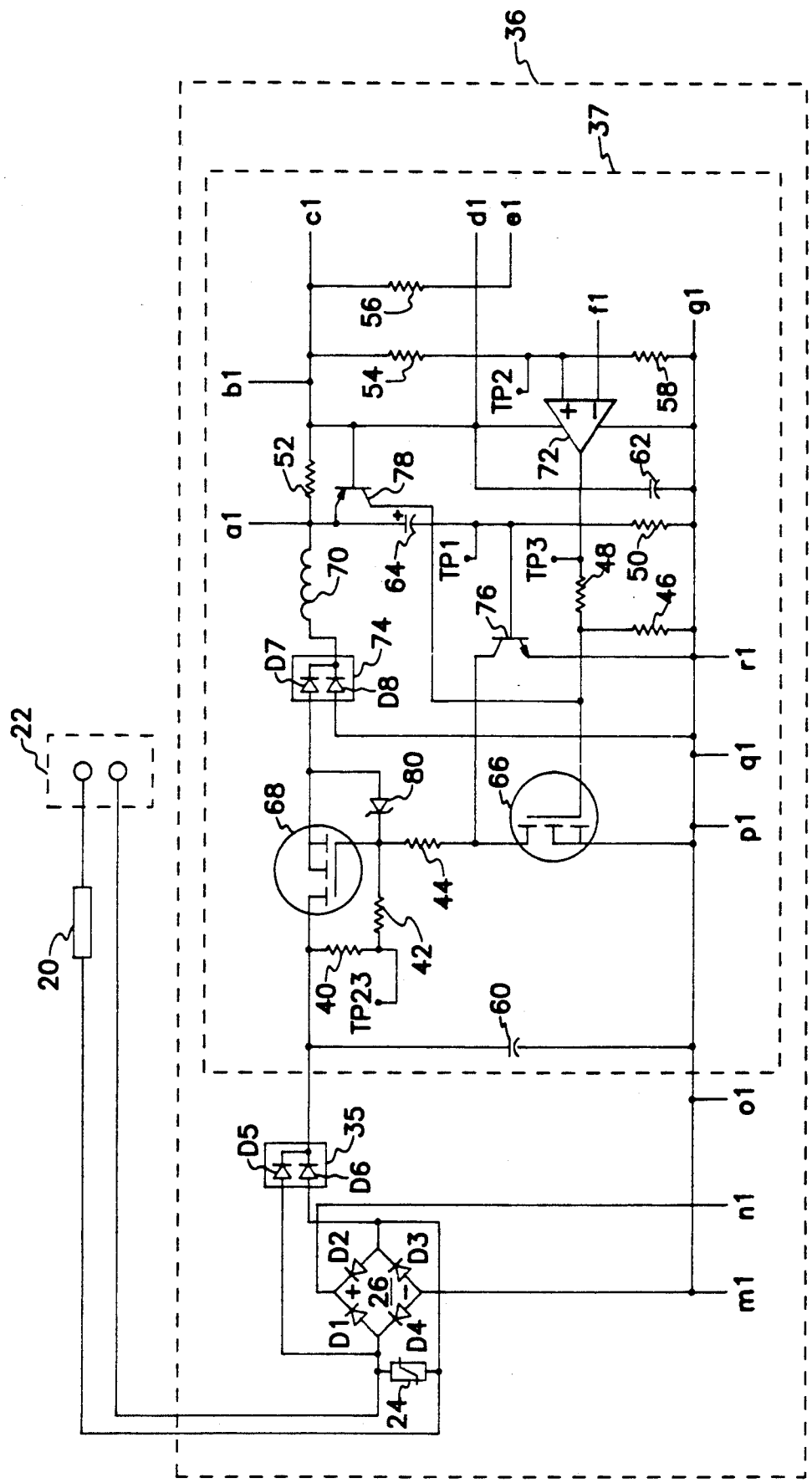
FIG. 4 is a schematic showing a preferred form of power source, load, rectifying circuit and switching regulator made according to the present invention.

Referring to FIG. 4, switching regulator 37 comprises resistors 40, 42, 44, 46, 48, 50, 52, 54, 56 and 58, capacitors 60, 62 and 64, field effect transistors (FETs) 66 and 68, an inductor 70, an operational amplifier 72, a dual diode rectifier 74, transistors 76 and 78, and a zener diode 80, all connected as shown. The dual diode rectifier 74 is further comprised of diodes D7 and D8. Switching regulator 37 is responsive to the full wave bridge rectifier 26 (FIG. 3) and essentially controls the impedance seen by load 20 via FET 68. When FET 68 is in its low impedance state, power is supplied to the circuit through an inductor 70 to the load 20. When the voltage rises across the output of the switching regulator 37 as set by the operational amplifier 72, FET 68 is placed in its high impedance state and the energy stored in the inductor 70 is returned to the circuit via dual diode rectifier ("flyback" diode) 74. Switching regulator 37 supplies approximately 8.5 volts DC to voltage regulator 39 (shown in detail in FIG. 5).

Figure 5:
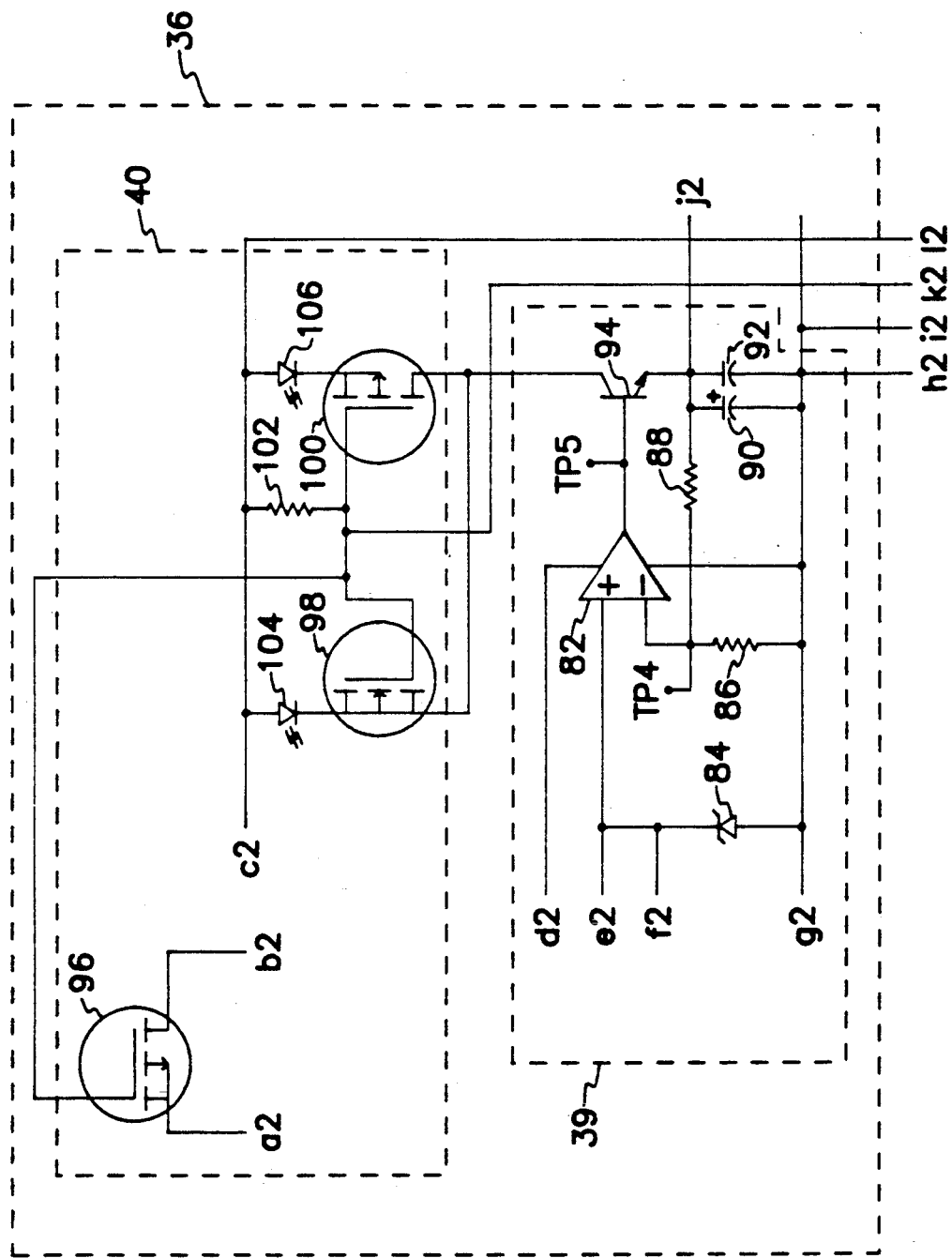
FIG. 5 is a schematic showing a preferred form of a voltage regulator and visual indicators made according to the present invention.

Referring to FIG. 5, voltage regulator 39 comprises an operational amplifier 82, a zener diode 84, resistors 86 and 88, capacitors 90 and 92, and a transistor 94, all connected as shown. FIG. 5 also shows FETs 96, 98 and 100, resistor 102, and LEDs 104 and 106, which are connected to voltage regulator 39 and switching regulator 37. Referring specifically to voltage regulator 39, zener diode 84 acts as a 1.2 volt reference for one of the inputs to operational amplifier 82. Resistors 86 and 88 set the gain of the operational amplifier 82 to ensure that the proper voltage will be available to sensor circuit 32. The operational amplifier 82 output will be about 5.0 volts DC (1.2 volts × [1 + [475/150]]), which is sufficient voltage for the sensor. The voltage regulator 39 is always operational regardless of the load's state and provides constant DC voltage to the sensor circuit 32. Transistor 94, connected to the output of operational amplifier 82, provides current gain, ensuring that proper current will be available to sensor circuit 32.

Still referring to FIG. 5, visual indicator circuitry 40 comprises resistor 102, light-emitting diodes (LEDs) 104 and 106 and FETs 96, 98 and 100. FET 96 and FET 100 are enhancement mode FETs. These FETs are in the high impedance state when their gate voltages are positive with respect to their source voltages. FET 98 is a N-channel FET and is in a low impedance state when its gate voltage is positive with respect to its source voltage, exactly the opposite logic of FETs 96 and 100. Thus, FET 98 and FET 100 are complementary, one being in a high impedance state and the other in a low impedance state all of the time. When FET 98 is conducting, LED 104 will be illuminated, indicating the absence of a triggering event or condition detected by sensor circuit 32. When FET 100 is conducting (FET 98 is not conducting), LED 106 will be illuminated, indicating the presence of a triggering event or condition detected by sensor circuit 32. LEDs 104 and 106 are of aid in troubleshooting the preferred embodiment of the invention once it is operative in the field.

Figure 6:
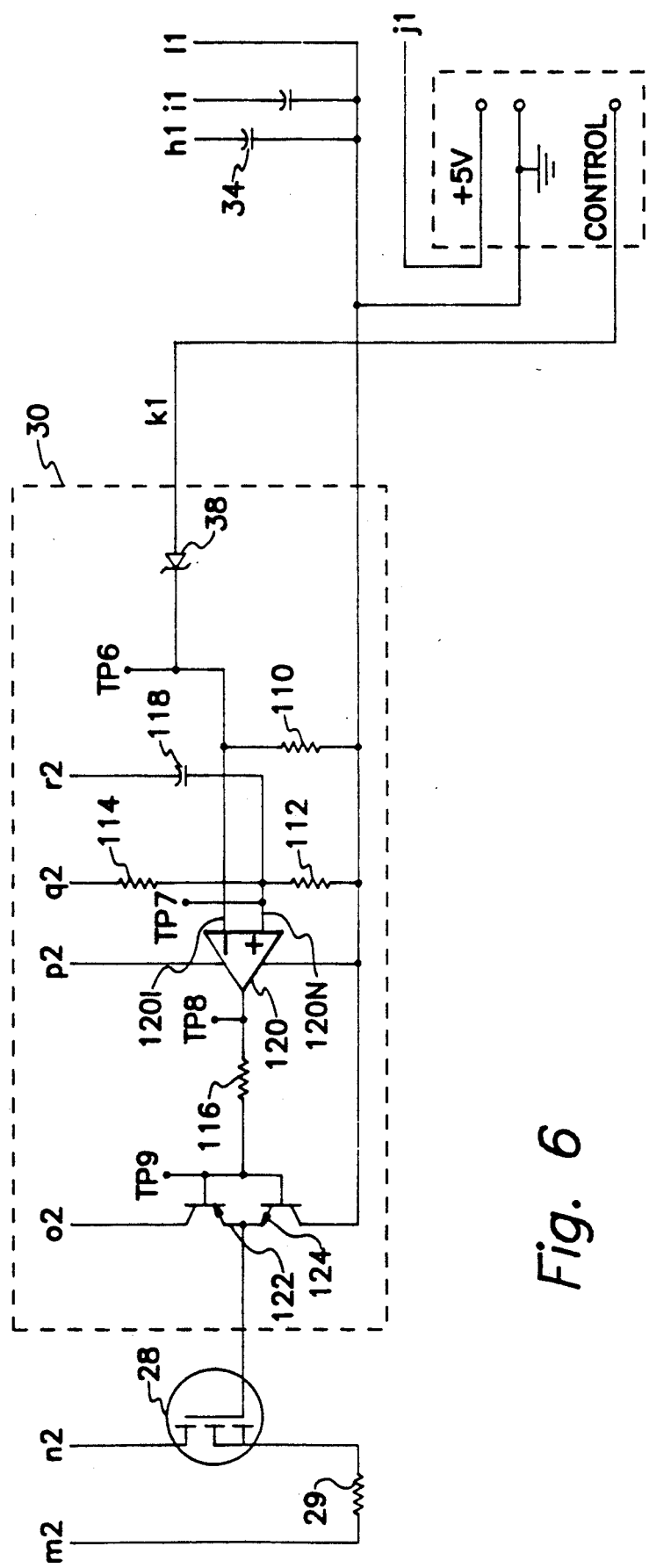
FIG. 6 is a schematic showing a preferred form of a switch means, gating means, storage means and sensor means made according to the present invention.

Again referring to FIG. 5, FET 96 essentially short circuits resistor 52 (FIG. 4) when an object is sensed, which disables the current limiting circuit formed by resistor 52 and transistor 78. This eliminates any delays in refreshing the charge stored in storage circuit 34 (FIG. 6). Thus, the current limiting circuit formed by resistor 52 and transistor 78 functions only on powering up the device and serves to minimize the initial surge of current that would otherwise occur and erroneously turn on the load 20. After powering up, FET 96 renders the current limiting circuit inoperable.

Referring to FIG. 6, storage circuit 34 (FIG. 3) consists of a 4.7 micro farad capacitor 34 and generates a storage signal indicative of the amount of electrical energy stored within it. Sensor circuit 32 comprises a photoelectric head, such as Honeywell part No. MPD2. However, it is clear to one of ordinary skill in the art that many other types of sensors could be used in conjunction with the present invention, including, but not limited to, an inductive proximity sensor, such as Honeywell part No. 977SO1.

Still referring to FIG. 6, gating circuit 30 comprises a zener diode 38, resistors 110, 112, 114 and 116, a capacitor 118, an operational amplifier 120 (functioning as a comparator) having an inverting input 120I and a non-inverting input 120N, and transistors 122 and 124, all connected as shown. Control line 126 of sensor circuit 32 is connected to zener diode 38 (a 6.8 volt zener diode), which, in turn, is connected to input 120I. Control line 126 carries a sensing signal which is generated by the sensor 32. The zener diode takes the sensing signal and generates a reference signal, which is input into the inverting terminal 120I of operational amplifier 120. If a triggering event has not occurred, input 120I is pulled high (to approximately 8.5 volts) by resistor 110, which is connected via zener diode 38 to an open collector or open drain output of the sensor circuit 32. Non-inverting input 120N of the operational amplifier is approximately 7.2 volts (i.e., 8.0 multiplied by [100/110] due to the resistor divider consisting of resistors 112 and 114). Since inverting input 120I is higher in voltage than non-inverting input 120N, the output of the operational amplifier 120 is switched to approximately zero volts and FET switch 28 (the switch means) is gated to its high impedance state. In this state, the regulator circuit 36 maintains the charge on the storage circuit 34 at about 8.5 volts.

Again referring to FIG. 6, when a triggering event occurs, control line 126 is driven low (to about zero volts), and inverting input 120I is reduced to about 6.8 volts (i.e., to the voltage drop across zener diode 38). Since non-inverting input 120N is still at about 7.2 volts, the output of the operational amplifier 120 is switched high, transistors 122 and 124 are switched to their low impedance states (placing a high voltage at the gate of FET 28), and FET 28 is switched to its low impedance state. This permits a predetermined quantity of electrical power to flow through the load 20, turning the load on and enabling the load to perform its intended function. Transistors 122 and 124 function together to provide current gain, helping the gate of FET 28 react quickly to the presence or absence of a triggering event. At this time, operational amplifier 120 and resistors 112 and 114 try to maintain 7.5 volts across storage circuit 34. However, storage circuit 34 begins to discharge in order to supply the necessary current required by the sensor circuit 32 and voltage regulator 39. Eventually, storage circuit 34 will not have sufficient voltage to maintain the high output of the operational amplifier 120 and FET 28 will switch to its high impedance state. The switching occurs when input 120N drops below about 6.8 volts (i.e., the voltage on inverting input 120I is maintained by the zener diode 38). Then, FET 68 (FIG. 4) will go to its low impedance state, allowing the regulator circuit 36 to both supply power to sensor circuit 32 and recharge storage circuit 34 (because it is less than 8.5 volts). Almost instantly, storage circuit 34 will be recharged, and the output of operational amplifier 120 will go high, placing FET 28 in its low impedance state and permitting a predetermined amount of current to flow through load 20 again. FET 28 goes to its high impedance state for such a short time that there is no impact on the load 20. In fact, the load 20 does not turn off during this time and only sees a slight difference in the impedance of FET 28 during the time the storage circuit 34 is being recharged.

Referring to FIG. 7, lines a1, b1, c1, d1, e1, f1 and g1 of FIG. 4 are connected to lines a2, b2, c2, d2, e2, f2 and g2 of FIG. 5, respectively. Further, lines h1, i1, j1, k1 and l1 of FIG. 6 are connected to lines h2, i2, j2, k2 and l2 of FIG. 5, respectively. Finally, lines m1, n1, o1, p1, q1 and r1 of FIG. 4 are connected to lines m2, n2, o2, p2, q2 and r2 of FIG. 6, respectively.

Those skilled in the art will recognize that the preceding preferred embodiment can be altered and modified without departing from the true spirit and scope of the invention as defined in the appended claims.

What is claimed is:

1. In an electrical system including a load capable of functioning for a predetermined purpose in response to transmission of at least a predetermined quantity of AC or DC electrical power through the load from an AC or DC source, an improved method for controlling transmission of the electrical power through the load in response to a predetermined condition comprising in combination the steps of:

conducting the predetermined quantity of electrical power through said load during a first operational state for causing the load to function for the predetermined purpose;

preventing the conduction of said predetermined quantity of electrical power through said load during a second operating state for preventing the load from functioning for the predetermined purpose;

storing electrical energy in response to said AC or DC source for enabling the monitoring of said predetermined condition;

detecting the presence of said predetermined condition;

cyclically during a time period when the presence of said predetermined condition is detected, switching to said first operating sate for causing the functioning of said load for the predetermined purpose, monitoring said predetermined condition by using the stored electrical energy, switching to the second operating state in response to the decrease of the stored electrical energy, switching to the second operating state in response to the decrease of the stored electrical energy below a predetermined value, replenishing the stored electrical energy during the second operating state for enabling the continued monitoring of said predetermined condition, and switching to said first operating state in response to the increase of the stored electrical energy for continuing the functioning of the load for the predetermined purpose, whereby the predetermined condition can be monitored in both the first and second operating states from an AC or DC source, wherein an electronic switch is connected in series with the load and the source, wherein said conducting step comprises the step of gating said electronic switch on in response to a first gating signal; generating pre-regulated DC power from said AC or DC source;

generating regulated DC power in response to said pre-regulated DC power;

charging said capacitor in response to said pre-regulated DC power;

generating a reference signal in response to said sensing signal; and generating said first gating signal in response to a predetermined relationship between said reference signal and a signal proportional to the value of said stored electrical energy, wherein preventing step comprises a step of gating off said electronic switch in response to a second gating signal, wherein said detecting step comprises a step of generating a sensing signal for indicating the presence of said predetermined condition by use of said regulated DC power.

2. The method, as claimed in claim 1 wherein the step of switching to said second operating state comprises the steps of:

generating a second reference signal in response to the sensing signal; and generating the second gating signal in response to a predetermined relationship between the second reference signal and a signal proportional to the decreased value of said stored electrical energy.

* * * * *